Figure 1:
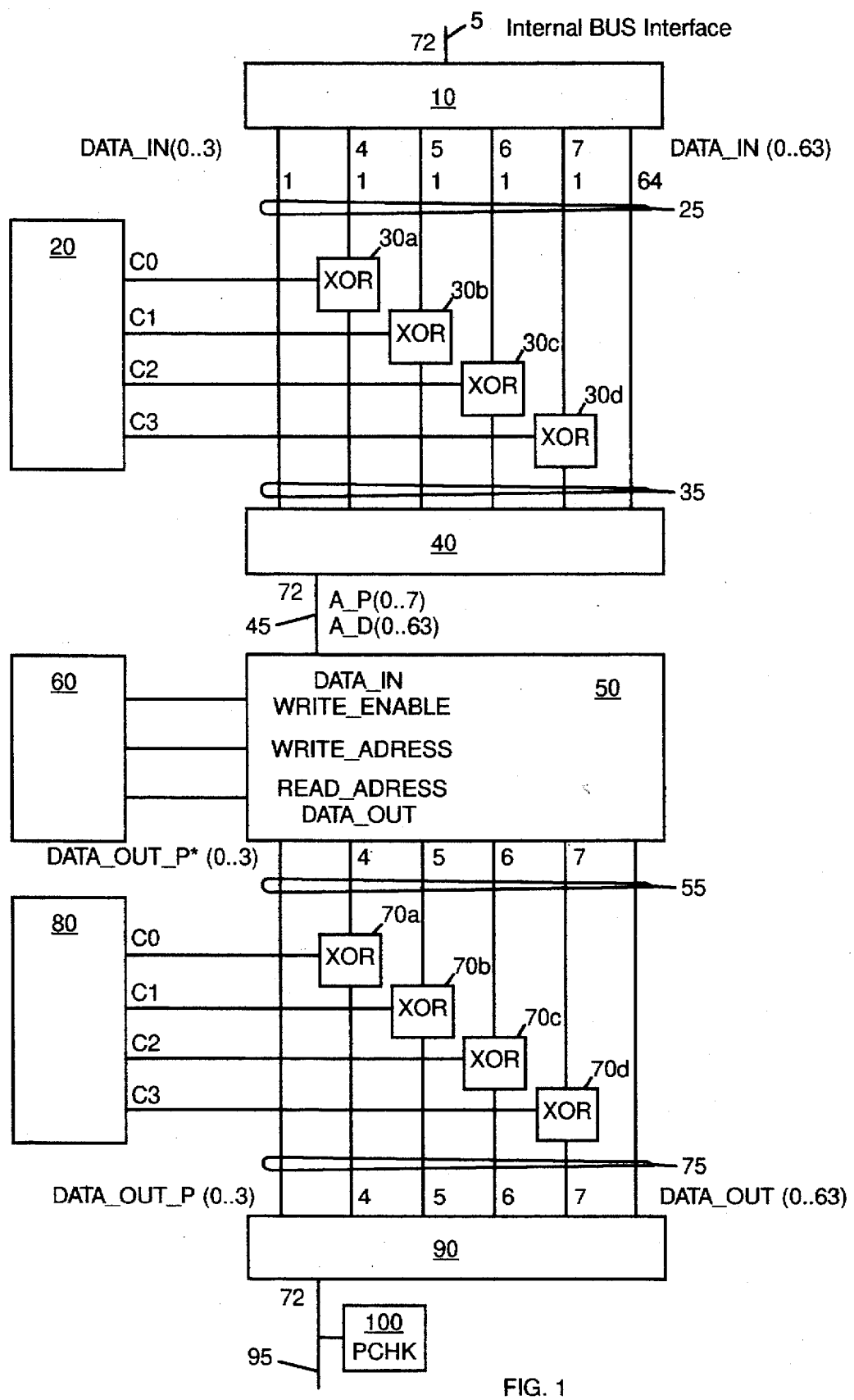

United States Patent [19]

Gervais et al.

[11] Patent Number: 5,694,400
[45] Date of Patent: Dec. 2, 1997

[54] CHECKING DATA INTEGRITY IN BUFFERED DATA TRANSMISSION

[75] Inventors: Gilles Gervais, Austin, Tex.; Ingemar Holm, Stuttgart, Germany; Helmut Kohler, Moensheim, Germany; Thomas Koehler, Holzgerlingen, Germany; Norbert Schumacher, Neuhausen, Germany; Gerhard Zilles, Jettingen,, Germany

[73] Assignee: International Business Machines Corporation, Armonk, N.Y.

[21] Appl. No.: 433,410

[22] PCT Filed: Dec. 15, 1993

[86] PCT No.: PCT/EP93/03572

§ 371 Date: Aug. 10, 1995

§ 102(e) Date: Aug. 10, 1995

[87] PCT Pub. No.: WO94/15290

PCT Pub. Date: Jul. 7, 1994

[30] Foreign Application Priority Data

Dec. 28, 1992 [DE] Germany ............... 42 44 275.3

[51] Int. Cl.$^6$ ................................................. G06F 11/10
[52] U.S. Cl. ........................ 371/21.2; 371/67.1; 364/717
[58] Field of Search ................................ 371/21.2, 51.1, 371/21.5, 49.1, 40.1, 37, 25.1, 67.1, 40.2; 364/717; 324/73.1

[56] References Cited

U.S. PATENT DOCUMENTS

| | | | |
|---|---|---|---|
| 4,531,213 | 7/1985 | Scheuneman | 371/3 |
| 4,692,893 | 9/1987 | Casper | 364/900 |
| 4,774,712 | 9/1988 | Lewis | 371/51 |
| 4,782,487 | 11/1988 | Smelser | 371/21 |
| 4,912,710 | 3/1990 | Rolfe | 371/71 |
| 5,033,048 | 7/1991 | Pierce et al. | 371/21.2 |
| 5,172,339 | 12/1992 | Norguchi et al. | 365/201 |
| 5,321,706 | 6/1994 | Holm et al. | 371/15.1 |

*Primary Examiner*—Robert W. Beausoliel, Jr.
*Assistant Examiner*—Nadeem Iqbal
*Attorney, Agent, or Firm*—Raymond M. Galasso; Jenkens & Gilchrist; Arthur J. Samodovitz

[57] ABSTRACT

Discloses a device and a method for checking by means of a checker (100). the data incorporating check bits read into a memory stack. The device comprises a first counter (20), which is connected through logical gates (30a–d) with some of the memory input lines (25), and a second counter (80) between the checker (100) and the memory (50), which is connected through logical gates (70a–d) to the memory output lines (55) corresponding to the memory input lines (25) with the first (20) and the second (80). counters generating continuous binary values. The method comprising the following stages: combination of the data to be read in with a value generated by a first counter (20) in accordance with an exclusive-OR operation; reading the logically combined data into the memory (50); reading the logically combined data from the memory (50); combination of the logically combined data read out with a value generated by a second counter (80) in accordance with an exclusive-OR operation; checking the data read out for parity in a parity checker (100). The invention may be used in a buffer memory (50) between two asynchronously timed buses.

4 Claims, 3 Drawing Sheets

| CYCLE | 4-BIT BIN. COUNTER | | | |
|---|---|---|---|---|
| | C0 | C1 | C2 | C3 |
| 0 | 0 | 0 | 0 | 0 |
| 1 | 0 | 0 | 0 | 1 |
| 2 | 0 | 0 | 1 | 0 |
| 3 | 0 | 0 | 1 | 1 |
| 4 | 0 | 1 | 0 | 0 |
| 5 | 0 | 1 | 0 | 1 |
| 6 | 0 | 1 | 1 | 0 |
| 7 | 0 | 1 | 1 | 1 |
| 8 | 1 | 0 | 0 | 0 |
| 9 | 0 | 0 | 0 | 0 |
| 10 | 0 | 0 | 0 | 1 |
| . | . | . | . | . |

FIG. 2

DATA_IN (0..63)   := B'01 01 01 01 00 01 00 00'
DATA_IN_P(0..7)   := B'00001011' (ODD PARITY)
C(0..3)           := B'0001'
                  := B'00000'
                  := B'00000'

1st WRITE OPERATION
A_D(0..63)   := DATA_IN(0..63)
A_P(0..3)    := DATA_IN_P(0..3) = B'0000'
A_P(4)       := DATA_IN_P(4) XOR C(0) = B'1'
A_P(5)       := DATA_IN_P(5) XOR C(1) = B'0'
A_P(6)       := DATA_IN_P(6) XOR C(2) = B'1'
A_P(7)       := DATA_IN_P(7) XOR C(3) = B'0'

1st READ OPERATION
DATA_OUT(0..63)   := B'01 01 01 01 00 01 00 00'
DATA_OUT_P(0..3)  := B'0000'
DATA_OUT_P(4)     := B'1' XOR C(0) = B'1'
DATA_OUT_P(5)     := B'0' XOR C(1) = B'0'
DATA_OUT_P(6)     := B'1' XOR C(2) = B'1'
DATA_OUT_P(7)     := B'0' XOR C(3) = B'1'

32nd READ OPERATION
DATA_OUT(0..63)   := B'01 01 01 01 00 01 00 00'
DATA_OUT_P(0..3)  := B'0000'
DATA_OUT_P(4)     := B'1' XOR C(0) = B'1'
DATA_OUT_P(5)     := B'0' XOR C(1) = B'1'
DATA_OUT_P(6)     := B'1' XOR C(2) = B'1'
DATA_OUT_P(7)     := B'0' XOR C(3) = B'0'

FIG. 3

| ARRAY ADRESS A(0..4) | CYCLE | COUNTER C0 | C1 | C2 | C3 | HEX VALUE OF COUNTER | |
|---|---|---|---|---|---|---|---|
| 00000 | 1 | 0 | 0 | 0 | 1 | 0 | |
| 00001 | 2 | 0 | 0 | 1 | 0 | 1 | |
| 00010 | 3 | 0 | 0 | 1 | 1 | 2 | |
| 00011 | 4 | 0 | 1 | 0 | 0 | 3 | 1st RECORD |
| 00100 | 5 | 0 | 1 | 0 | 1 | 4 | |
| 00101 | 6 | 0 | 1 | 1 | 0 | 5 | |
| 00110 | 7 | 0 | 1 | 1 | 1 | 6 | |
| 00111 | 8 | 1 | 0 | 0 | 0 | 7 | |
| 01000 | 9 | 0 | 0 | 0 | 0 | 8 | |
| 01001 | 10 | 0 | 0 | 0 | 1 | 0 | |
| 01010 | 11 | 0 | 0 | 1 | 0 | 1 | |
| 01011 | 12 | 0 | 0 | 1 | 1 | 2 | 2nd RECORD |
| 01100 | 13 | 0 | 1 | 0 | 0 | 3 | |
| 01101 | 14 | 0 | 1 | 0 | 1 | 4 | |
| 01110 | 15 | 0 | 1 | 1 | 0 | 5 | |
| 01111 | 16 | 0 | 1 | 1 | 1 | 6 | |
| 10000 | 17 | 1 | 0 | 0 | 0 | 7 | |
| 10001 | 18 | 0 | 0 | 0 | 0 | 8 | |
| 10010 | 19 | 0 | 0 | 0 | 1 | 0 | |
| 10011 | 20 | 0 | 0 | 1 | 0 | 1 | 3rd RECORD |
| 10100 | 21 | 0 | 0 | 1 | 1 | 2 | |
| 10101 | 22 | 0 | 1 | 0 | 0 | 3 | |
| 10110 | 23 | 0 | 1 | 0 | 1 | 4 | |
| 10111 | 24 | 0 | 1 | 1 | 0 | 5 | |
| 11000 | 25 | 0 | 1 | 1 | 1 | 6 | |
| 11001 | 26 | 1 | 0 | 0 | 0 | 7 | |
| 11010 | 27 | 0 | 0 | 0 | 0 | 8 | |
| 11011 | 28 | 0 | 0 | 0 | 1 | 0 | 4th RECORD |
| 11100 | 29 | 0 | 0 | 1 | 0 | 1 | |
| 11101 | 30 | 0 | 0 | 1 | 1 | 2 | |
| 11110 | 31 | 0 | 1 | 0 | 0 | 3 | |
| 11111 | 32 | 0 | 1 | 0 | 1 | 4 | |
| 00000 | 33 | 0 | 1 | 1 | 0 | 5 | |
| 00001 | 34 | 0 | 1 | 1 | 1 | 6 | |
| 00010 | 35 | 1 | 0 | 0 | 0 | 7 | |
| 00011 | 36 | 0 | 0 | 0 | 0 | 8 | 5th RECORD |
| 00100 | 37 | 0 | 0 | 0 | 1 | 0 | |
| 00101 | 38 | 0 | 0 | 1 | 0 | 1 | |
| 00110 | 39 | 0 | 0 | 1 | 1 | 2 | |
| 00111 | 40 | 0 | 1 | 0 | 0 | 3 | |
| 01000 | 41 | 0 | 1 | 0 | 1 | 4 | |
| 01001 | 42 | 0 | 1 | 1 | 0 | 5 | |
| 01010 | 43 | 0 | 1 | 1 | 1 | 6 | |
| 01011 | 44 | 1 | 0 | 0 | 0 | 7 | 6th RECORD |
| 01100 | 45 | 0 | 0 | 0 | 0 | 8 | |
| 01101 | 46 | 0 | 0 | 0 | 1 | 0 | |
| 01110 | 47 | 0 | 0 | 1 | 0 | 1 | |
| 01111 | 48 | 0 | 0 | 1 | 1 | 2 | |
| 10000 | 49 | 0 | 1 | 0 | 0 | 3 | |
| 10001 | 50 | 0 | 1 | 0 | 1 | 4 | |
| 10010 | 51 | 0 | 1 | 1 | 0 | 5 | |
| 10011 | 52 | 0 | 1 | 1 | 1 | 6 | 7th RECORD |
| 10100 | 53 | 1 | 0 | 0 | 0 | 7 | |
| 10101 | 54 | 0 | 0 | 0 | 0 | 8 | |
| 10110 | 55 | 0 | 0 | 0 | 1 | 0 | |
| 10111 | 56 | 0 | 0 | 1 | 0 | 1 | |
| 11000 | 57 | 0 | 0 | 1 | 1 | 2 | |
| 11001 | 58 | 0 | 1 | 0 | 0 | 3 | |
| 11010 | 59 | 0 | 1 | 0 | 1 | 4 | |
| 11011 | 60 | 0 | 1 | 1 | 0 | 5 | 8th RECORD |
| 11100 | 61 | 0 | 1 | 1 | 1 | 6 | |
| 11101 | 62 | 1 | 0 | 0 | 0 | 7 | |
| 11110 | 63 | 0 | 0 | 0 | 0 | 8 | |
| 11111 | 64 | 0 | 0 | 0 | 1 | 0 | |

FIG. 4

CHECKING DATA INTEGRITY IN BUFFERED DATA TRANSMISSION

The invention relates to a device and a method for checking data having check bits stored into a transit memory using a checker in accordance with the conception part of the first claim.

Data transmission between two data buses using a buffer memory is appropriate if the two buses are operating asynchronously, i.e. if they are timed by different timing signals. The buffer memory used in this form of data transmission is a FIFO (first-in, first-out) or memory stack device, into which the data are written to the one bus and from which they are read out from the other bus after a short delay. The two different timing signals are prevented from influencing one another through the use of this buffer memory.

It is already known how to determine whether the data in the buffer memory have been read in completely, at the correct place and in the correct sequence. To this end, parity or check bits were, in the past, stored with the data read in. The parity or check bits are used after the data are read to verify the correctness of the data and to correct them, where necessary.

A different solution is known from European Patent Application no. EP-A-0 463 210 (IBM). This discloses a method by means of which the individual bits of the address of the cell's in the memory where the data are stored are logically combined with some of the bits of the data read into the stack in accordance with an exclusive-OR operation. As the data are read out, the logically combined bits are logically combined again with the bits of the cell address in accordance with an exclusive-OR operation and the parity of the data is checked. A mismatch in the parity indicates an error in the memory device.

These methods have the disadvantage that they only check whether the cells in the memory are operating correctly: there is no verification of whether the data were written into the correct memory cells or read out from the correct memory cells. It could clearly be the case that the address logic that generates the addresses of the memory cells has generated incorrect addresses or that the write enable line between the address logic and the memory array is defective. Such errors impair the integrity of the data, in that incorrect data with correct parity of check bit can be read out from the buffer memory without the knowledge of the user or the system.

The objective of the invention therefore is to specify a device and a method to check the functioning of the address logic and of the memory.

This objective is achieved in that a different code is generated for the same address line on the subsequent pass through the memory stack. The use of different codes for each pass has the advantage that the address generation mechanism and the write enable line of the memory stack are subjected to a check. In one embodiment, the code generation method is selected such that memory addresses the interval between which is divisible by 2 are assigned different codes.

In a preferred embodiment, the logical gates are exclusive-OR gates and the first and second code generators are counters.

The object is further achieved by means of a method for checking the data having parity bits and written into a memory stack with one or more address lines comprising the following stages:

a) Combination of the data to be read in with a code generated by a first code generator in accordance with a first logical operation;

b) reading the logically combined data into the memory;

c) reading the logically combined data from the memory;

d) combination of the logically combined data read out with a code generated by a second code generator, which code is matched With the code generated by the first code generator in accordance with a second logical operation;

e) checking the data read out against a check code, with a different code being generated for the same address line on a subsequent pass through the memory stack.

In the preferred embodiment, the first and the second code generators generate continuous binary numbers and the individual bits of the binary number are combined with one of the memory in or memory out lines in accordance with the first or second logical operation respectively. The logical operations are preferably exclusive-OR operations. The data are checked for parity.

The invention will be described in further detail below on the basis of the practical example illustrated in the drawing, which shows:

FIG. 1 an overview diagram of the buffer memory comprising a checking mechanism, FIG. 2 the possible counter statuses of the code generator, FIG. 3 an example of data written into and read from the memory and FIG. 4 the counter status after each cycle.

The diagrammatic illustration in FIG. 1 shows the basic structure of the buffer memory with checker in accordance with the invention. The arrangement comprises a memory array 50, a load register 40, connected to the memory array 50 by way of lines 45, an output register 90, connected to the memory array 50 by means of lines 75 and the address logic 60 which generates the WRITE_ENABLE, WRITE_ADDRESSES and READ_ADDRESSES signals and thus controls the write and read processes of the memory array 50.

The memory array 50 in the preferred embodiment has four registers, which can each store 8 double words. The data to be stored in the memory array 50 comprise 64 data bits and 8 check bits. Memory array 50 can thus provide space for up to 32 data units (64 data bits and 8 check bits).

A receive register 10 is connected with a data bus 5 and accepts from data bus 5 the data to be stored in the memory array 50. The receive register 10 is connected with the load register 40 through lines 25 and 35. A parity checker 100 is located at the output of the output register 90 to check the bits output on a bus 95 for correct parity and generates an error signal if the parity is incorrect.

The diagram in FIG. 1 further shows two code generators. 20, 80, of which the first 20 is combined with four of the lines 25 by means of exclusive-OR gates 30a–30d. The second code generator is connected by means of exclusive-OR gates 70a–70d with four of the lines 55 which correspond to the four lines logically combined with the first code generator 20. In the practical example illustrated, the code generators 20 and 80 are combined with the lines 25 or 55 which carry the fourth, fifth, sixth and seventh check bits DATA_ON_P(4 . . . 7) and DATA_OUT_P*(4 . . . 7). Code generators 20 and 80 could, however, be connected with any of the lines 25 and 55, whether they are carrying check bits or data bits, as long as the second code generator 80 is combined with the lines 55 corresponding to the lines 25 with which the first code generator 20 is logically combined.

The two code generators 20 and 80 are built up of normal 4-bit counters, having a start value of B'0000' and an end value of B'1000' as is shown in FIG. 2 The value in the counter incremented by 1 in each cycle until the end value of B'1000' is reached in the eighth cycle. After this, i.e. in the ninth cycle, the counter begins again with the initial value B'0000'.

The functioning of the invention will now be described on the basis of FIGS. 3 and 4. It is assumed that a read operation must be executed each time after a write operation at the same memory location. Writing data to the same memory location twice, without an intermediate read operation, is not permitted.

FIG. 3 shows the initial condition for reading data into the memory array 50. In this example, the data comprises the following data bits DATA_IN(0 . . . 63): H'01 01 01 01 00 01 00 00' (hexadecimal representation) and the following check bits (DATA_IN_P(0 . . . 7): B'00001011' (binary representation). These are read into the receive register 10 from the data bus 5. In the first subsequent cycle, the first code generator 20 has the value B'0001' C(0 . . . 3). This value is combined with the fourth to seventh bit of the check bits DATA_IN_P(4 . . 7) of the data according to an exclusive-OR operation and the modified data are written into the load register 40. In the load register 40, the data bits A_D(0 . . . 63) and the first four check bits A_P(0 . . . 3) have unmodified values, i.e. data bits A_D(0 . . . 63) are identical to the data bits DATA_IN(0 . . . 63) arriving from bus 5 and check bits A_P (0 . . . 3) are identical to the check bits DATA_IN_P (0 . . . 3) arrived from bus 5, whereas the last four check bits DATA_IN_P(4 . . . 7) now have the value B'1010', as is shown in FIG. 3. In the next cycle, the WRITE_ENABLE signal is brought high to set memory array 50 into write mode, so that the data from the load register 40 are written into the memory cells which have been addressed by write addresses. Since these data are the first data to be written into the memory array 50, they are written to the first memory cell (address B'00000').

When the next data arriving on the bus 5 are being written, the counter value is incremented by 1, so that the four check bits DATA_IN_P (4 . . . 7) for the next data are now combined with the value B'0010' in accordance with an exclusive-OR operation. These next data are written to the memory cells of memory array 50 at address B'00001'. This process is repeated for all data arriving on bus 5, with the counter value of code generator 20 and the address to which the data are to be written being incremented by 1 each time, as is shown in FIG. 4.

In the example illustrated, memory array 50 only has room for 32 data items. For this reason, once data have been written to the last memory cells (address B'1111') of memory array 50, the subsequent data are written into the first memory locations (address B'0000'), as long as the data previously stored in these memory location has already been read out. In practice, the data are constantly being written into and read from the memory, and so it is only in exceptional cases where a memory array 50 is fully occupied.

In order to read out data from the memory cells in the memory array 50, the address of the data to be read out is generated by the address logic 60 and passed to the memory array 50 as READ_ADDRESS. The data referred to appear at the output terminals of the memory array 50 and are transmitted through the lines 55 and 75 to the output register 90. Four bits of the data, the fourth, fifth, sixth and seventh check bits DATA_OUT_P*(4 . . . 7) are combined by means of the exclusive-OR gates 70a–70c in accordance with an exclusive-OR operation with the value of the second code generator 80.

When the first data are read from the memory cells in memory array 50 indicated by address B'0000', the value C(0 . . . 3) of the second code generator 80 is equal to B'0001'. This is the same as the value with which the four check bits DATA_IN_P(4 . . . 7) were combined in accordance with an exclusive-OR operation when read into the memory array 50. For this reason, as long as the data are correct and were written into the correct memory cells, their original values are restored by the second logical operation in accordance with an exclusive-OR operation through the exclusive-OR gates 70a–70d. This restoration is also shown in FIG. 3. Each time the data are read from the memory array 50, the counter value of the second code generator is incremented by and the data are read from the memory locations with the next higher address.

The parity checker 100 checks the data in the output register 90 for the correct parity. In the example shown in FIG. 3, the data had an odd parity when the data were read in. After logical combination of the data in the exclusive-OR gates 30a–30d and restoration of the data in the exclusive-OR gates 70a–70d, the data to be written held in the receive register 10 should have the same parity as the data read out and held in the output register 90. If this is not the case, an error has occurred in the buffer memory 50 and an error correction measure can be executed.

Detection of an error during writing of the data into memory array 50 can also be explained using FIG. 3 and FIG. 4. Here it is assumed that the correct data have been written into the memory cells at address B'0000' in the first write cycle. These data are read out in the first read cycle without an error message as described above. After 31 further write cycles, the next data arriving on bus 5 must again be written into the memory cells at address B'0000'. The fourth, fifth, sixth and seventh check bits DATA_IN_P(4 . . . 7) are combined together with the value from the first code generator 20 in an exclusive-OR operation. In the 33rd cycle, however, the counter status does not have the value of B'0001' as in the first cycle, but the value of B'0110' as is shown in FIG. 4.

It is now assumed that, because of an error in the WRITE_ENABLE signal, e.g. an interruption in the write enable line between the address logic 60 and the memory array 50, these new data, which have been logically combined with the value B'0110' have not been written to the memory cells in memory array 50 at the address B'0000. Instead, the old data, logically combined with the value B'0001' remain in these memory cells. During the read of the data in the 33rd read cycle, the second code generator has a counter status of B'0110'. This value is logically combined with the old data, which had been logically combined with the value B'0001' in the exclusive-OR gates 70a–70d in accordance with an exclusive-OR operation and passed on to the output register 90. The parity checker 100 checks the parity of these incorrectly logically combined data and reports an error, since the parity of the data is no longer-correct. Error correction measures can then be executed to restore the integrity of the data.

We claim:

1. A device for checking by means of a checker (100) data incorporating check bits read into a transmit memory (50) having one or more address lines, with the device having a first code generator (20), which is connected through logical gates (30a–d) with some of the memory input lines (25), and a second code generator (80), which is connected between the checker (100) and the memory (50) through logical gates (70a–d) with the memory output lines 55 corresponding to the memory input lines, with the first (20) and the second (80) code generators generating matched codes for each address line in the transmit memory (50), characterized in that a different code is generated for the same address line on the subsequent pass through the transmit memory (50) so that said checker can verify whether the data was read into a correct one of said address lines or whether the data was read from a correct one of said address lines.

2. The device in accordance with claim 1, characterized in that the logical gates (30a–d, 70a–d) are exclusive-OR gates.

3. A method for checking data having parity bits and being written into a transit memory (50) with one or more address lines comprising the following stages:

a) combination of the data to be read in with a code generated by a first code generator (20) in accordance with a first logical operation;

b) reading the logically combined data into the memory (50);

c) reading the logically combined data from the memory (50);

d) combination of the logically combined data read with a code generated by a second code generator (80), which code is matched with the code generated by the first code generator (20) in accordance with a second logical operation;

e) checking the data read out against a check code, characterized in that a different code is generated for the same address line on a subsequent pass through the memory (50) so that said checking step can verify whether the data was read into a correct one of the address lines or whether the data was read from a correct one of the address lines.

4. The method in accordance with claim 3 in which the first (20) and the second (80) code generators generate continuous binary numbers.

* * * * *